United States Patent
Allen et al.

(10) Patent No.: US 10,548,237 B2
(45) Date of Patent: Jan. 28, 2020

(54) EXTERNALLY ACCESSIBLE REPLACEABLE POWER SOURCE

(71) Applicant: Hewlett Packard Enterprise Development LP, Houston, TX (US)

(72) Inventors: Joseph R. Allen, Tomball, TX (US); John Norton, Houston, TX (US); Bradley E. Mayes, Houston, TX (US); James H. Singer, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/550,845

(22) PCT Filed: Feb. 20, 2015

(86) PCT No.: PCT/US2015/016952
§ 371 (c)(1),
(2) Date: Aug. 14, 2017

(87) PCT Pub. No.: WO2016/133545
PCT Pub. Date: Aug. 25, 2016

(65) Prior Publication Data
US 2018/0049342 A1     Feb. 15, 2018

(51) Int. Cl.
*H05K 7/14* (2006.01)
*G06F 1/18* (2006.01)

(52) U.S. Cl.
CPC ........... *H05K 7/1492* (2013.01); *G06F 1/188* (2013.01)

(58) Field of Classification Search
CPC .... G06F 1/188; H05K 7/1485; H05K 7/1487; H05K 7/1492
USPC ................................ 361/679.33, 724–727
See application file for complete search history.

(56) References Cited

U.S. PATENT DOCUMENTS

| | | | | |
|---|---|---|---|---|
| 5,506,750 A | * | 4/1996 | Carteau ................. | G11B 33/128 361/679.32 |
| 5,574,625 A | * | 11/1996 | Ohgami ................. | G06F 1/1626 312/223.2 |
| 5,621,890 A | * | 4/1997 | Notarianni ............. | G06F 1/1632 361/724 |
| 5,692,208 A | * | 11/1997 | Felcman ................ | G06F 1/1616 312/9.29 |

(Continued)

FOREIGN PATENT DOCUMENTS

| JP | 2002044207 | 2/2002 |
|---|---|---|
| JP | 2003297311 | 10/2003 |

(Continued)

OTHER PUBLICATIONS

IBM User's Guide; "IBM System X3550 Type 7978," Aug. 2006, 16 pages.

*Primary Examiner* — Adrian S Wilson
(74) *Attorney, Agent, or Firm* — Hewlett Packard Enterprise Patent Department

(57) ABSTRACT

Examples disclosed herein provide a compute server system comprising a plurality of nodes. In one example, each node generally includes a replaceable power source externally accessible to the node, and a guide for housing the replaceable power source. The guide generally includes conductive elements to make contact with conductive elements of the replaceable power source, and an elastic member to eject the replaceable power source from the node.

7 Claims, 5 Drawing Sheets

(56) References Cited

U.S. PATENT DOCUMENTS

| | | | |
|---|---|---|---|
| 5,777,398 A * | 7/1998 | Valkeakari | G06F 1/184 307/150 |
| 5,777,845 A * | 7/1998 | Krum | G11B 33/08 206/592 |
| 5,809,311 A | 9/1998 | Jones | |
| 6,018,456 A * | 1/2000 | Young | G06F 1/181 361/679.4 |
| 6,188,573 B1 * | 2/2001 | Urita | G06F 1/1616 165/80.3 |
| 6,219,257 B1 * | 4/2001 | Arnold | H01M 2/1055 361/726 |
| 6,262,894 B1 * | 7/2001 | Nelson | H05K 7/1421 312/223.2 |
| 6,310,783 B1 * | 10/2001 | Winch | H01M 2/1077 361/679.02 |
| 6,373,706 B1 * | 4/2002 | Kasahara | G06F 1/1616 361/679.37 |
| 6,445,579 B1 * | 9/2002 | Singleton, Jr. | G06F 1/1616 248/65 |
| 6,643,139 B2 * | 11/2003 | Tien | G06F 1/1616 292/148 |
| 6,785,141 B2 * | 8/2004 | Fang | G06F 1/184 312/223.2 |
| 6,833,995 B1 * | 12/2004 | Hsue | G06F 1/20 211/184 |
| 6,978,903 B2 * | 12/2005 | Son | G06F 1/184 211/26 |
| 7,042,720 B1 * | 5/2006 | Konshak | G06F 13/409 361/679.33 |
| 7,151,673 B2 * | 12/2006 | Le | G06K 19/07741 361/737 |
| 7,267,550 B1 | 9/2007 | Eckberg | |
| 7,414,854 B1 | 8/2008 | Douglas | |
| 7,570,484 B1 * | 8/2009 | Sivertsen | G06F 1/187 361/679.37 |
| 8,018,729 B2 * | 9/2011 | Skinner | G06F 1/185 361/679.58 |
| 8,149,586 B2 * | 4/2012 | Curnalia | H05K 7/1455 361/726 |
| 8,708,736 B2 | 4/2014 | Bailey | |
| 8,737,057 B2 * | 5/2014 | Terry | G11B 33/124 361/679.33 |
| 9,226,425 B2 * | 12/2015 | Hsu | H05K 7/1488 |
| 9,433,119 B2 * | 8/2016 | Canfield | H05K 7/1417 |
| 2002/0119697 A1 * | 8/2002 | Chan | H01R 13/5213 439/519 |
| 2003/0030975 A1 * | 2/2003 | Bestwick | G06F 1/183 361/679.51 |
| 2003/0099096 A1 * | 5/2003 | Megason | H05K 7/1405 361/759 |
| 2005/0186816 A1 * | 8/2005 | Franz | H01R 13/62933 439/157 |
| 2006/0002077 A1 * | 1/2006 | Carlson | G11B 33/12 361/679.31 |
| 2006/0139859 A1 | 6/2006 | Wong | |
| 2008/0028237 A1 | 1/2008 | Knight | |
| 2008/0316684 A1 * | 12/2008 | Kilpinen | H01M 2/1066 361/679.01 |
| 2009/0016009 A1 * | 1/2009 | Barrall | G06F 1/187 361/679.31 |
| 2009/0086456 A1 * | 4/2009 | Milo | H05K 7/1409 361/801 |
| 2009/0256364 A1 * | 10/2009 | Gadau | G06F 1/1616 292/128 |
| 2009/0311903 A1 * | 12/2009 | Bychkov | G06K 13/0806 439/352 |
| 2011/0133559 A1 * | 6/2011 | Yamashita | G06F 1/30 307/66 |
| 2012/0026671 A1 | 2/2012 | Wang | |
| 2012/0036322 A1 * | 2/2012 | Klein | G06F 1/187 711/114 |
| 2013/0342990 A1 | 12/2013 | Jau | |
| 2014/0152099 A1 | 6/2014 | Boyd | |
| 2014/0172158 A1 | 6/2014 | Paradissis | |
| 2014/0232350 A1 | 8/2014 | Chan | |
| 2015/0036279 A1 * | 2/2015 | Erdman | G06F 1/1628 361/679.31 |
| 2017/0371385 A1 * | 12/2017 | Leigh | G06F 1/20 |
| 2018/0168065 A1 * | 6/2018 | Thiel | H05K 7/1492 |
| 2018/0337372 A1 * | 11/2018 | Rivera | H01M 10/0525 |

FOREIGN PATENT DOCUMENTS

| | | |
|---|---|---|
| JP | 2004199996 | 7/2004 |
| WO | WO-0176001 | 10/2001 |

* cited by examiner

EXTERNALLY ACCESSIBLE REPLACEABLE POWER SOURCE

BACKGROUND

Computers, including rack-mount servers and blade servers, for example, typically employ backup power sources to maintain information stored in volatile storage in the event of power failure. In this way, data will not be lost as a result of an unexpected power outage. Such power sources include replaceable power sources, such as battery systems that can be inserted into and removed from the computer.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Computers, such as rack-mount servers and blade servers, for example, typically use volatile storage to store data during operation. In order to prevent loss of information stored in volatile storage due to unexpected power outages and maintain system operation, computers typically employ backup power systems to maintain power, at least temporarily, during outages. Such backup power systems typically include replaceable power sources, such as removable batteries or battery packs. As with any battery technology, batteries take time to charge, they have a limited lifespan, and will eventually fail and need to be replaced.

Examples disclosed herein provide a way of replacing a hot-pluggable replaceable power source, such as a backup battery or capacitive power source, without powering down or disassembling servers, or systems including a plurality of servers. As server downtime may impact business continuity, potentially translating to a loss in revenue, introducing a methodology to add and/or remove a power source in a live environment may prove beneficial since server downtime may be eliminated.

Figure 1:
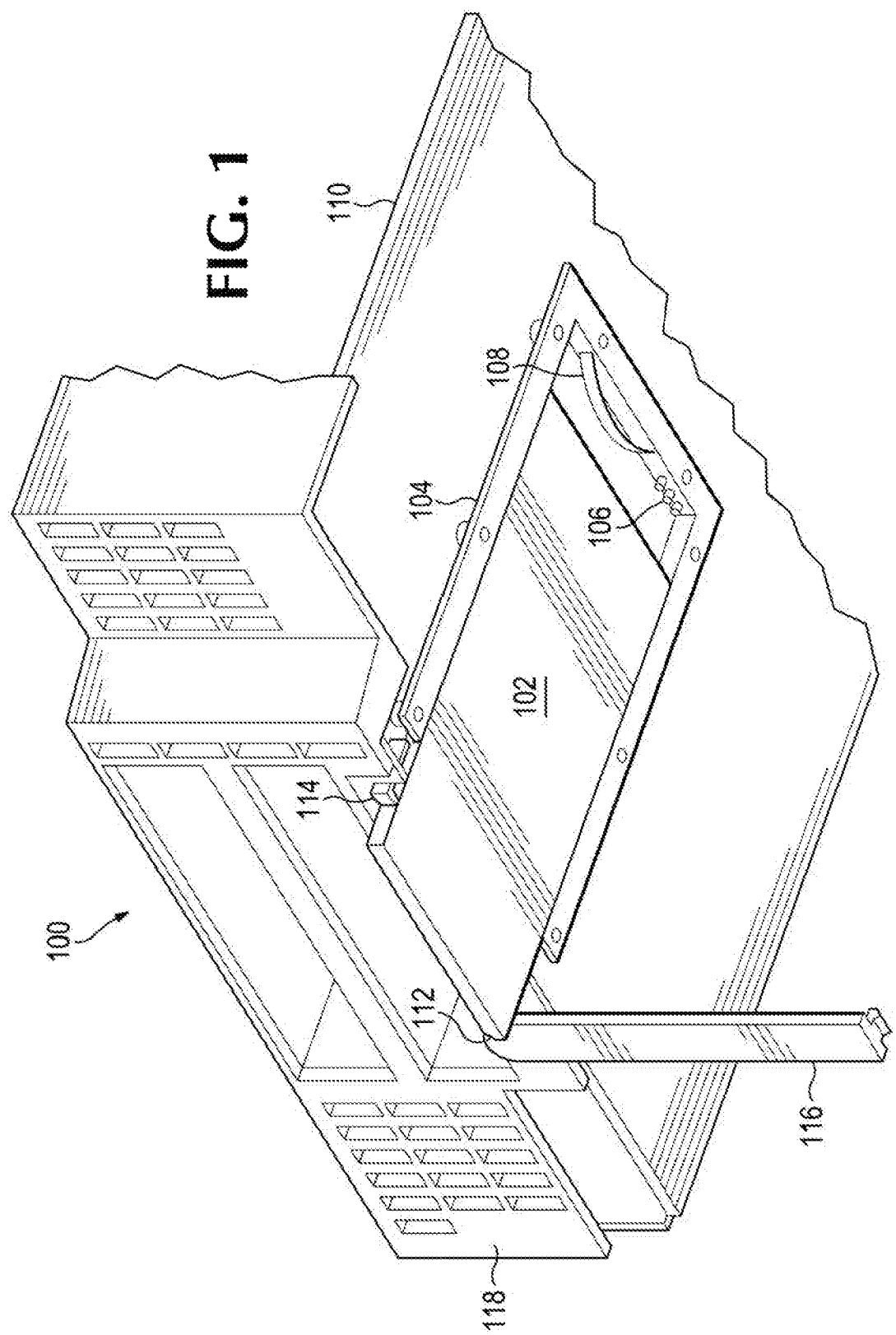
FIG. 1 illustrates a computer having a replaceable power source externally accessible to the computer, according to an example.

With reference to the figures, FIG. 1 illustrates a computer, such as a rack-mount server or a blade server, having a replaceable power source 102 externally accessible to the computer, according to an example. With regards to servers, the computer may be a node 100 of a compute server system including a plurality of nodes. As will be further described, by having a replaceable power source 102 that is hot-pluggable and externally accessible to the node 100, the power source 102 may be added or replaced without powering down or disassembling the node 100 (or compute server system), thereby eliminating downtime of resources.

Referring to FIG. 1, the node 100 includes a guide 104 for housing the replaceable power source 102 and facilitating an electrical connection between the power source 102 and the node 100. The guide includes conductive elements 106 (e.g., spring contacts) to make electrical contact with conductive elements of the replaceable power source 102 (e.g., see conductive elements 202 of the power source 102 in FIG. 2). The guide 104 may include features for properly housing the replaceable power source 102 within the node 100. As an example, the guide 104 may be rails for securing the replaceable power source 102 as it is slid into an access opening of the node 100.

In order to ensure that the replaceable power source 102 is properly inserted according to a certain orientation, the power source 102 may include an indexing feature 112 or attachment feature to engage a corresponding attachment feature of the guide 104. As an example, the indexing feature 112 of the replaceable power source 102 may be a slotted edge (further illustrated in FIG. 2). By having the slotted edge on only one side of the replaceable power source 102, and a corresponding feature on only one side of the guide 104, the power source 102 may be housed within the guide 104 according to a fixed orientation each time. As a result, the indexing feature 112 of the replaceable power source 102 may ensure that conductive elements of the power source 102 always makes electrical connection with the conductive elements 106 within the guide 104.

The placement of the guide 104 within the node 100 may be chosen in order to make it convenient to add or replace the power source 102. For example, for a compute server system including a plurality of nodes 100, in addition to the replaceable power source 102 being externally accessible, having convenient access to the power source 102 may prove beneficial, particularly when a number of power sources 102 may have to be added or replaced for the nodes of the compute server system. As an example, the replaceable power source 102 may be externally accessible via a faceplate 118 of the node 100. However, although the replaceable power source 102 is externally accessible via a front fascia of the node 100, as illustrated, the placement of the guide 104 for housing the power source 102 may vary. For example, the replaceable power source 102 may be externally accessible via any other faceplate of the node 100.

Figure 3A:
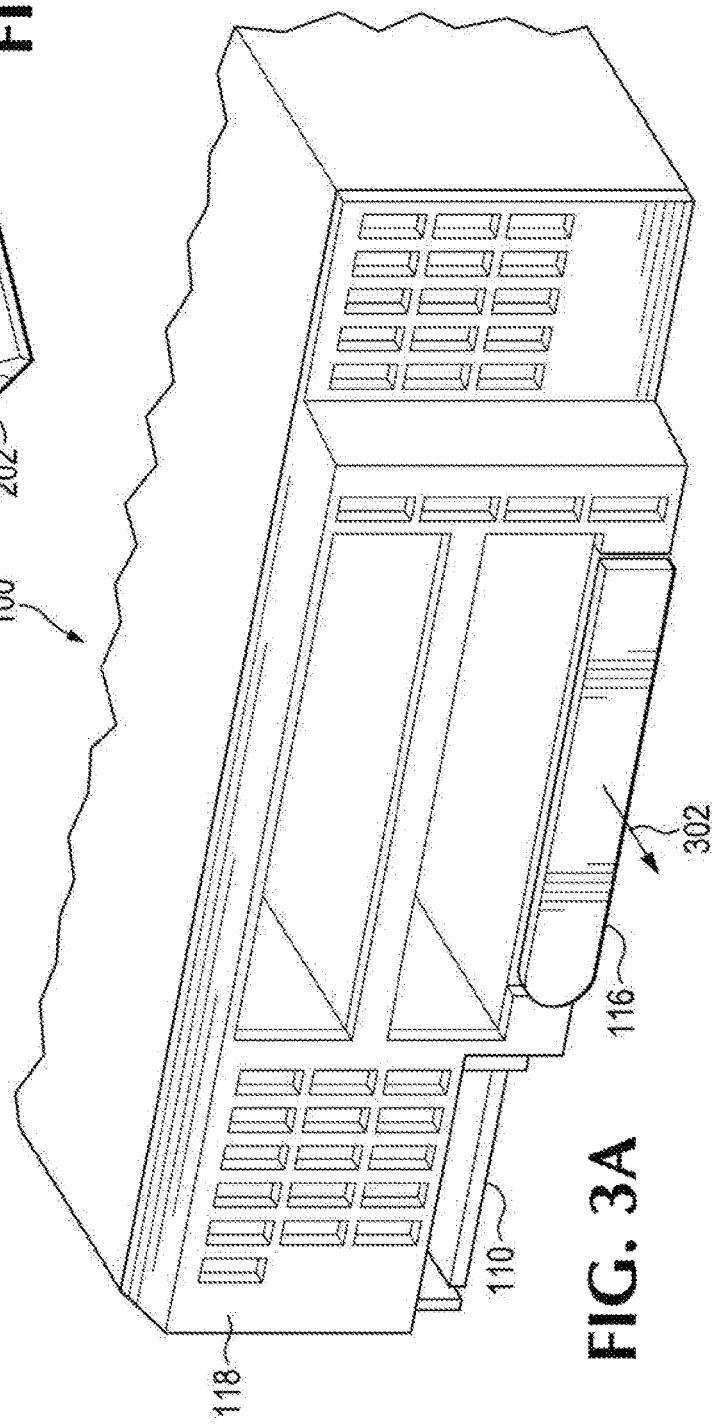
FIGS. 3A-D illustrate an example methodology to add and/or remove the replaceable power source from the computer without powering down or disassembling the computer.
Figure 3B:
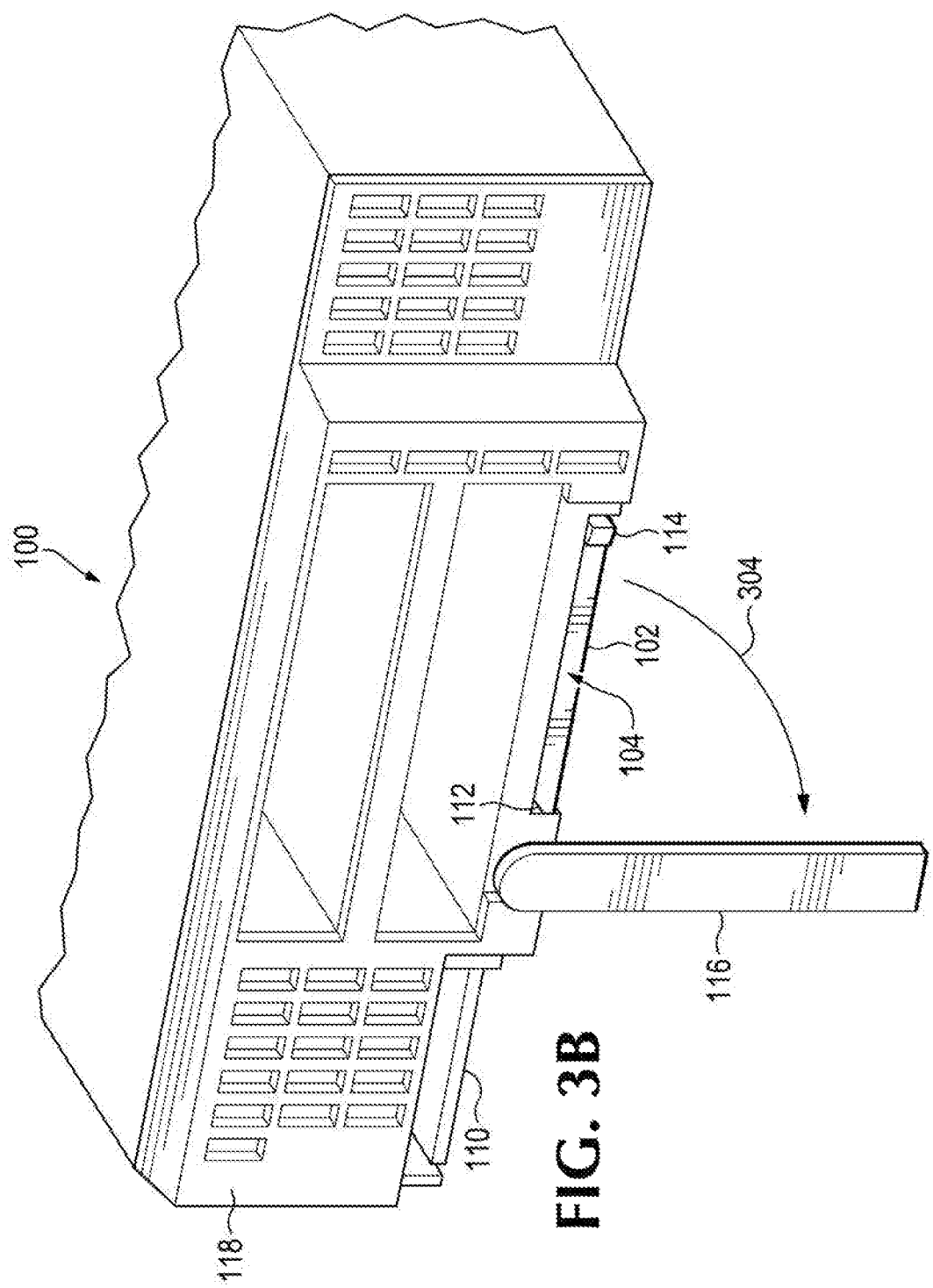
Figure 3C:
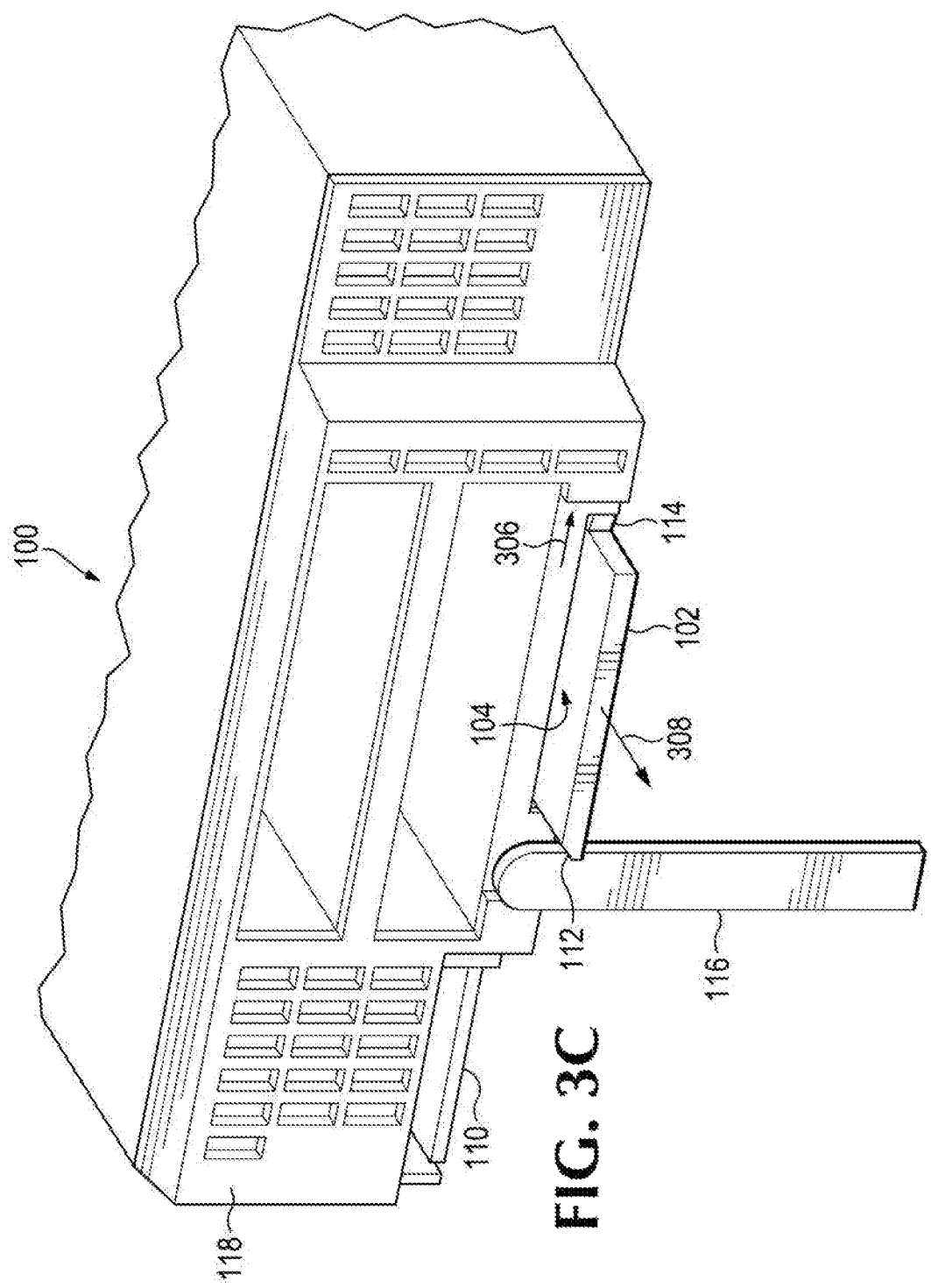
Figure 3D:
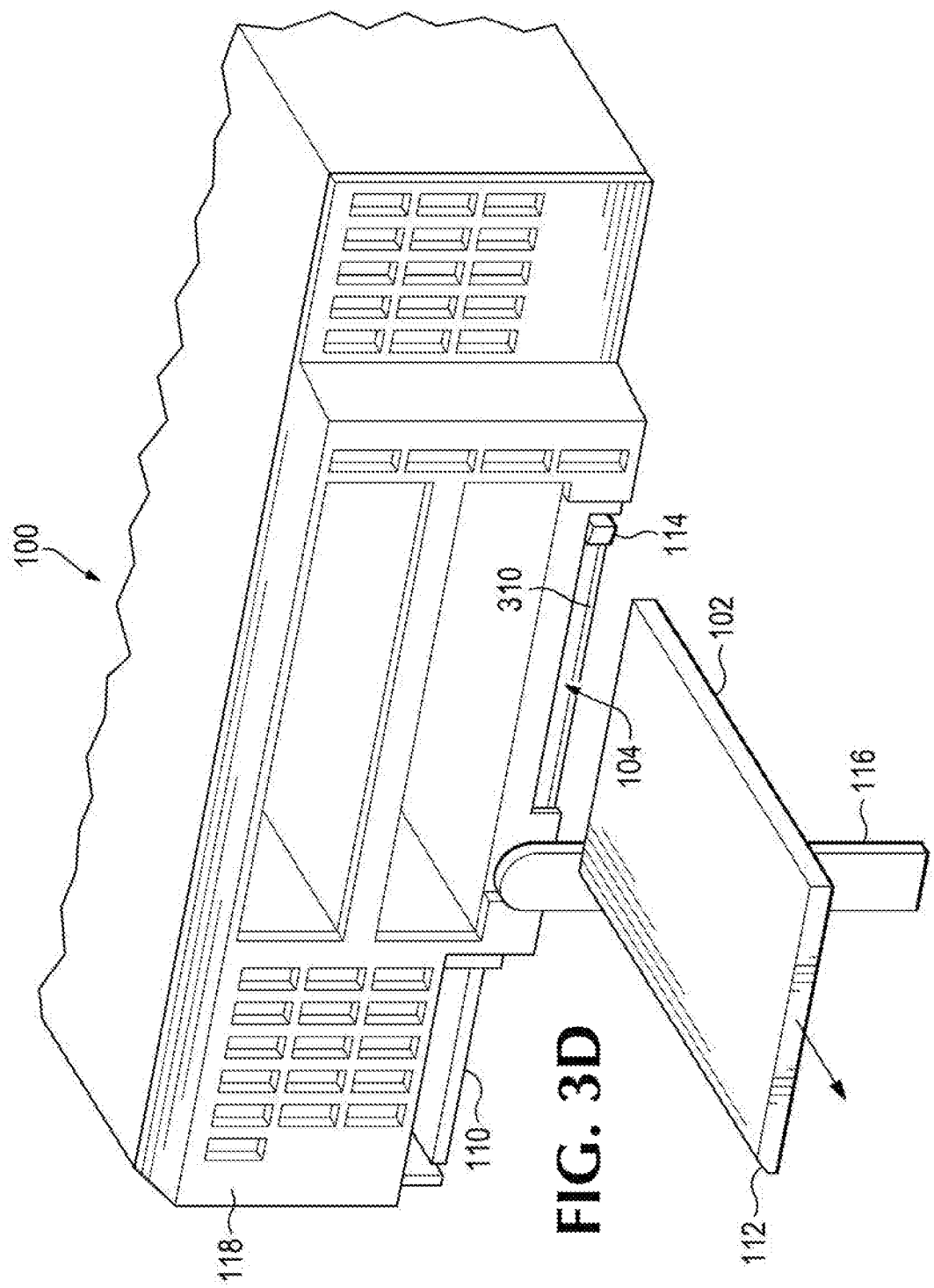

As an example, the guide 104 may be disposed between a printed circuit assembly 110 of the node 100 and an outside chassis of the node 100, as illustrated (e.g., see outside chassis 310 in FIG. 3D). The printed circuit assembly 110 may include the conductive elements 106 made available within the guide 104, or the conductive elements 106 may be wired to the printed circuit assembly 110. As a result, the replaceable power source 102 may be electrically connected to various components of the printed circuit assembly 110, for example, to provide backup power to maintain power, at least temporarily, during outages.

As spacing within the node 100 for accommodating various components may be valuable, creating a space between the printed circuit assembly 110 and the outside chassis of the node 100 for housing the replaceable power source 102 may be ideal. However, due to the limited spacing between the printed circuit assembly 110 and the outside chassis, the thickness and, therefore, the capacity of the replaceable power source 102 may be limited, requiring for the power source 102 to have a thin form factor.

Although the guide 104 is illustrated as being disposed below the printed circuit assembly 110, the guide 104 may also be disposed above the printed circuit assembly 110.

As an example, the guide 104 may include a door 116 to secure the replaceable power source within the guide 104. Referring to FIG. 1, the door 116 is left open in order to access replaceable power source 102. The configuration of the door 116 is not limited to what is illustrated in the figures. As an example, other configurations can include a spring and hinged door, a sliding door, or no door at all.

As an example, the guide 104 may include a latch system 114 to secure the replaceable power source 102 within the guide 104 or to assist in ejecting the power source 102 from the guide 104. Referring to FIG. 1, the guide 104 may include an elastic member 108 (e.g., ejector spring) to eject the replaceable power source 102 when it is no longer secured by the latch system 114. As an example, the latch system 114 may be a lever that secures a corner of the replaceable power source 102, as will be further described with reference to FIGS. 3A-D. For example, when the lever is pushed away to no longer secure the corner of the replaceable power source 102, the power source 102 may be released (e.g., with assistance from the elastic member 108). The latch system 114 is not limited to what is illustrated in the figures. For example, the latch system 114 may be a button to eject the replaceable power source 102. As another example, a push-push type latch system may be incorporated as a means for securing and ejecting the replaceable power source 102.

Figure 2:
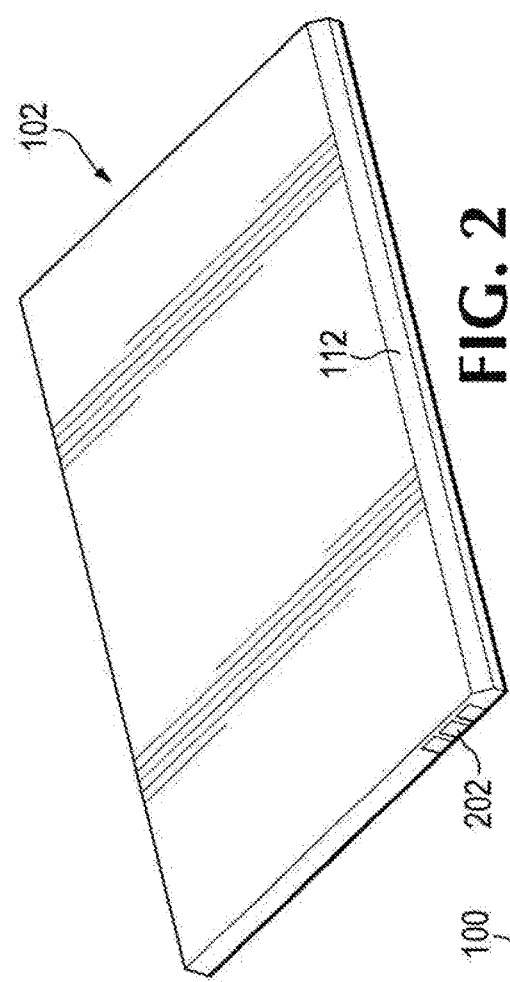
FIG. 2 illustrates features of the replaceable power source, according to an example.

FIG. 2 illustrates features of the replaceable power source 102, according to an example. Examples of a replaceable power source 102 include, but are not limited to, a rechargeable battery, disposable battery, or a capacitive power source. The dimensions or form factor of the replaceable power source 102 may vary based on the location of the guide 104 within the node. For example, based on the space available, a larger power source 102 may be utilized in order to provide more capacity. As described above, the replaceable power source 102 may include an indexing feature 112 or attachment feature to engage a corresponding attachment feature of the guide 104. As a result, the indexing feature 112 of the replaceable power source 102 may ensure that conductive elements 202 of the power source 102 always makes electrical connection with the conductive elements 106 within the guide 104. As an example, the indexing feature 112 may be a slotted edge, as illustrated.

As an example, in order to know when to replace a failed or aging battery, an external visual monitor (e.g., LEDs) may be available on the node 100 to indicate the battery life and/or battery health status of the replaceable power source 102. For example, the health status may be indicated by a red, yellow, or green light. As another example, a notice may be made available to a user or administrator to indicate the battery life of the replaceable power sources from a plurality of nodes of a compute server system, and a battery replacement schedule may be provided.

FIGS. 3A-D illustrate an example methodology to add and/or remove a replaceable power source 102 from a node 100 without powering down or disassembling the node 100. Hot plugging the replaceable power source 102 without powering down the node 100 may eliminate the downtime of valuable resources. Referring to FIG. 3A, the door 116 may be pulled forward (indicated by arrow 302). As an example, rather than being pulled forward, the door 116 may be actuated open by pushing on the door 116. Referring to FIG. 3B, the door 116 may be swung open, in order to obtain access to the replaceable power source 102. As an example, the door 116 may be swung downward (indicated by arrow 304). The configuration of the door 116 is not limited to what is illustrated in the figures. As an example, other configurations can include a spring and hinged door, a sliding door, or no door at all.

As illustrated, the replaceable power source 102 is accessible via an access opening located on a front fascia or faceplate 118 of the node 100. In addition, the replaceable power source 102 may be disposed within a guide 104 located between a printed circuit assembly 110 and an outside chassis of the node 100 (e.g., see outside chassis 310 in FIG. 3D). However, although the replaceable power source 102 is externally accessible via a front fascia of the node 100, below the printed circuit assembly 110, as illustrated, the placement of the guide 104 for housing the power source 102 may vary. For example, the replaceable power source 102 may be externally accessible via any other faceplate of the node 100.

A latch system 114 may be used to secure the replaceable power source 102 within the guide 104. As an example, the latch system 114 may be a lever that secures a corner of the replaceable power source 102, as illustrated in FIG. 3B. Referring to FIG. 3C, once the latch system 114 is pushed to no longer secure the corner of the replaceable power source 102 (indicated by arrow 306), the power source 102 may be released from the guide 104 (indicated by arrow 308). As described above, the guide 104 may include an elastic member 108 (e.g., ejector spring) to eject the replaceable power source 102 when it is no longer secured by the latch system 114.

The latch system 114 is not limited to what is illustrated in the figures. For example, the latch system 114 may be a button to eject the replaceable power source 102. As another example, a push-push type latch system may be incorporated as a means for securing and ejecting the replaceable power source 102. Referring to FIG. 3D, once the replaceable power source 102 is no longer secured by the latch system 114, the power source 102 may be ejected to provide enough clearance for a user to grab the end of the power source 102 and pull it completely out from the node 100, as illustrated by the arrow.

Although FIGS. 3A-D illustrate the removal of the replaceable power source 102 from the node, similar steps may be taken in reverse order to add the power source 102 to the node 100. For example, referring to FIG. 3D, the replaceable power source 102 may be inserted or pushed into the access opening of the guide 104 (opposite direction of the arrow indicated). Referring to FIG. 3B, the replaceable power source 102 may be pushed in until the latch system 114 secures the corner of the power source 102. Finally, referring to FIG. 3A, the door 116 may be rotated to cover the access opening and pushed in to snap the door 116 in place (opposite direction of arrow 302).

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A blade enclosure comprising a plurality of blade servers, each blade server comprising:

a replaceable power source externally accessible via a faceplate of the blade server, wherein the replaceable power source is hot-pluggable; and a guide for housing the replaceable power source, wherein the guide is disposed between a printed circuit assembly of the blade server and an outside chassis of the blade server, and wherein the guide comprises:

conductive elements to make contact with conductive elements of the replaceable power source; and an elastic member to eject the replaceable power source from the node.

2. The blade enclosure of claim 1, wherein the faceplate for each blade server comprises an access opening to access the replaceable power source.

3. The blade enclosure of claim 1, wherein the replaceable power source for each blade server comprises an indexing feature to house the power source in the guide according to an orientation.

4. The blade enclosure of claim 1, wherein the guide for each blade server comprises a latch system to secure the replaceable power source within the guide or to eject the replaceable power source from the guide.

5. The blade enclosure of claim 1, wherein the guide for each blade server comprises a door to secure the replaceable power source within the guide, wherein the door is externally accessible to the blade server.

6. The blade enclosure of claim 4, wherein the latch system comprises a button to eject the replaceable power source from the guide when the button is depressed.

7. The blade enclosure of claim 4, wherein the latch system comprises a lever to release the replaceable power source from the guide when the lever is pushed to no longer secure a corner of the replaceable power source.

* * * * *